United States Patent
Fujii et al.

(10) Patent No.: US 8,336,866 B2
(45) Date of Patent: Dec. 25, 2012

(54) STAGE FOR SUBSTRATE

(75) Inventors: Yasushi Fujii, Kanagawa (JP); Takuma Hasegawa, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 336 days.

(21) Appl. No.: 12/384,719

(22) Filed: Apr. 8, 2009

(65) Prior Publication Data
US 2009/0250855 A1 Oct. 8, 2009

(30) Foreign Application Priority Data
Apr. 8, 2008 (JP) .................................. 2008-100250

(51) Int. Cl.
*B25B 1/00* (2006.01)
*B25B 1/02* (2006.01)
*B25B 1/10* (2006.01)
*B25B 5/00* (2006.01)
*B25B 1/24* (2006.01)
*B24B 5/16* (2006.01)
*B23Q 3/00* (2006.01)
*H01L 21/687* (2006.01)

(52) U.S. Cl. .............. 269/249; 269/147; 269/3; 269/283

(58) Field of Classification Search .................. 269/903, 269/249, 3, 4, 147, 283, 284, 269
See application file for complete search history.

(56) References Cited

U.S. PATENT DOCUMENTS

| | | | | |
|---|---|---|---|---|
| 4,189,230 A | * | 2/1980 | Zasio | 355/76 |
| 4,799,659 A | * | 1/1989 | Donovan | 269/289 R |
| 5,376,216 A | * | 12/1994 | Yoshioka et al. | 156/345.55 |
| 5,848,670 A | * | 12/1998 | Salzman | 187/272 |
| 5,989,342 A | * | 11/1999 | Ikeda et al. | 118/52 |
| 6,111,706 A | * | 8/2000 | Incera et al. | 359/822 |
| 6,120,609 A | * | 9/2000 | Selyutin et al. | 118/728 |
| 6,152,031 A | * | 11/2000 | DeCruz | 101/129 |
| 6,217,705 B1 | * | 4/2001 | Tamura et al. | 156/345.53 |
| 6,336,991 B1 | * | 1/2002 | Tamura et al. | 156/345.51 |
| 6,540,014 B2 | * | 4/2003 | Getchel et al. | 165/80.1 |
| 6,630,053 B2 | * | 10/2003 | Yamagishi et al. | 156/345.32 |
| 6,676,805 B2 | * | 1/2004 | Tamura et al. | 156/345.53 |
| 6,677,167 B2 | * | 1/2004 | Kanno et al. | 438/14 |
| 6,711,810 B2 | * | 3/2004 | Buley et al. | 29/830 |
| 6,873,058 B2 | * | 3/2005 | Kobayashi | 257/778 |

(Continued)

FOREIGN PATENT DOCUMENTS

JP 2001-160586 A 6/2001

(Continued)

*Primary Examiner* — Lee D Wilson
*Assistant Examiner* — Alvin Grant
(74) *Attorney, Agent, or Firm* — Carrier Blackman & Associates, P.C.; William D. Blackman; Joseph P. Carrier

(57) ABSTRACT

A stage is provided on which is mounted a substrate that has a concavo-convex portion such as a circuit formed on the underside thereof. A channel 3 through which a coolant such as water flows is formed in a stage 1. An annular flange portion 4 is formed on the top surface of the stage 1. The inner side of the flange portion 4 forms a concave portion 5. The top surface of the flange portion 4 is provided with a smooth finish in order to mount a peripheral section of the underside of a substrate W thereon. Holes through which are passed three positioning pins 6 and lift pins 7 are provided in the flange portion 4 at regular intervals in the circumferential direction.

10 Claims, 2 Drawing Sheets

U.S. PATENT DOCUMENTS

| | | | |
|---|---|---|---|
| 6,887,317 B2 * | 5/2005 | Or et al. | 118/728 |
| 7,537,810 B2 * | 5/2009 | Hayashi et al. | 428/1.1 |
| 7,654,010 B2 * | 2/2010 | Moriya et al. | 34/449 |
| 7,862,658 B2 * | 1/2011 | Yamasaki et al. | 118/715 |
| 2002/0046706 A1 * | 4/2002 | Tamura et al. | 118/728 |
| 2002/0174950 A1 * | 11/2002 | Park | 156/345.1 |
| 2003/0121439 A1 * | 7/2003 | Dannoux et al. | 101/485 |
| 2003/0136341 A1 * | 7/2003 | Na | 118/500 |
| 2004/0040933 A1 * | 3/2004 | Kanno et al. | 216/67 |
| 2005/0009226 A1 * | 1/2005 | Kumagai et al. | 438/69 |
| 2007/0159192 A1 * | 7/2007 | Hasegawa et al. | 324/754 |
| 2009/0314211 A1 * | 12/2009 | Du Bois et al. | 118/729 |

FOREIGN PATENT DOCUMENTS

| | | | |
|---|---|---|---|
| JP | 2003-158160 A | | 5/2003 |
| JP | 2007036070 A | * | 2/2007 |

* cited by examiner

STAGE FOR SUBSTRATE

BACKGROUND OF THE INVENTION

1. Field of the Invention

The present invention relates to a stage for a substrate on which is mounted a substrate such as a semiconductor wafer.

2. Description of the Related Art

Semiconductors that require ultrafine fabrication such as a MEMS (Micro Electro Mechanical System) or a thick film circuit board are manufactured utilizing photolithography techniques. When applying a photolithography technique such as exposure, development, or etching, a substrate is fixed on a stage and the photolithography technique is performed.

Japanese Patent Laid-Open No. 2001-160586 proposes a stage in which a peripheral section of the stage and a peripheral section of through holes for lift pins are caused to project more than another section, and the remaining section is configured as a concave portion. By allowing a coolant to flow to the concave portion, the stage can cool the substrate efficiently.

Further, Japanese Patent Laid-Open No. 2003-158160 discloses a device in which a hand delivers a substrate to a stage. The hand is provided with an annular suction surface at an outer circumferential section of a circular suction portion, and suction holes that connect to a vacuum chamber are formed in the suction surface.

SUMMARY OF THE INVENTION

Generally, the top surface of a stage is a flat plane for stably fixing a substrate, and the entire area of the underside of the substrate contacts with the top surface of the stage. However, in some cases, a circuit or concavo-convex portion is formed on the underside of a substrate for manufacturing a MEMS. In such case, if the entire area of the underside of the substrate is brought in contact with the stage, there is a risk that the circuit or concavo-convex portion formed on the underside will be broken or deformed.

Since a concave portion that supplies a coolant is formed in the stage according to Japanese Patent Laid-Open No. 2001-160586, the underside of a substrate does not contact with the stage at that portion, and hence a circuit or a convex portion is not broken. However, according to Japanese Patent Laid-Open No. 2001-160586, since the periphery of a lift-pin through hole protrudes, that peripheral part contacts with the underside of a substrate. Further, the tip of the lift pin also contacts with the underside of a substrate in the vicinity of the center of the underside of the substrate. Therefore, if a circuit or the like is formed on the underside, the circuit or the like will be damaged.

Although the device proposed in Japanese Patent Laid-Open No. 2003-158160 is not a stage, application of that idea to a stage can also be considered. However, Japanese Patent Laid-Open No. 2003-158160 does not disclose a solution with respect to how to align the peripheral section of a substrate with the peripheral section of the hand. Further, although a lift pin is required for the stage, a solution with respect to treatment of the lift pin is also not disclosed.

According to the present invention for solving the above problem, there is provided a stage in which a flange portion is provided that mounts a peripheral section of a substrate to a peripheral section of the stage; a concave portion that forms a gap with an underside of a substrate on which an electric circuit or the like is formed is arranged on an inner side of the flange portion; substrate positioning pins are formed on a top surface of the flange portion; and lift pins for transferring a substrate pass through the flange portion.

A configuration may also be adopted in which the bottom surface of the concave portion is formed in a curved shape in which a central part is the deepest part and an outer circumferential section is the shallowest part. By adopting this configuration, even when a substrate is bent by its own weight, the gap between the underside of the substrate and the bottom surface of the concave portion is constant, and processing can be performed in a stable manner.

It is preferable with respect to stable processing to adopt a configuration in which the number of positioning pins and lift pins is three or more, respectively, and the positioning pins and lift pins are arranged at regular intervals in the circumferential direction, respectively.

According to the stage of the present invention, a substrate having a concavo-convex portion such as a circuit on the underside thereof can be retained without damaging the concavo-convex portion. Furthermore, a substrate can be positioned automatically, and a lift pin does not contact against a circuit or the like on the underside when transferring a substrate.

Accordingly, the stage of the present invention is useful when utilizing a photolithography technique to manufacture a semiconductor that requires ultrafine fabrication, such as a MEMS (Micro Electro Mechanical System), or a thick film circuit board.

DETAILED DESCRIPTION OF THE PREFERRED EMBODIMENT

Figure 1:
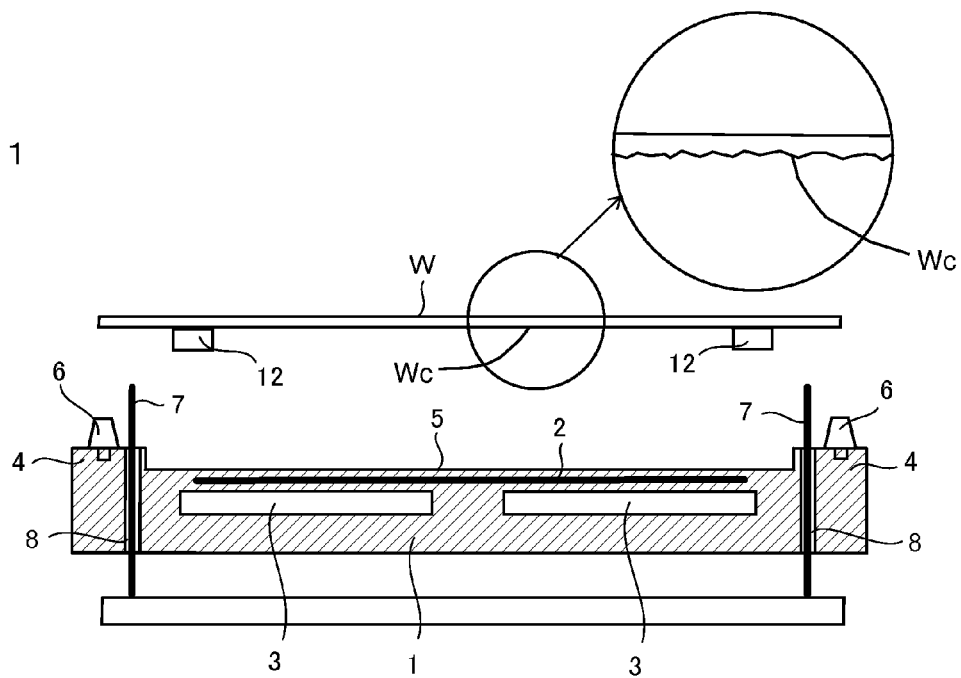
FIG. 1 is a front view of a stage according to the present invention.
Figure 2:
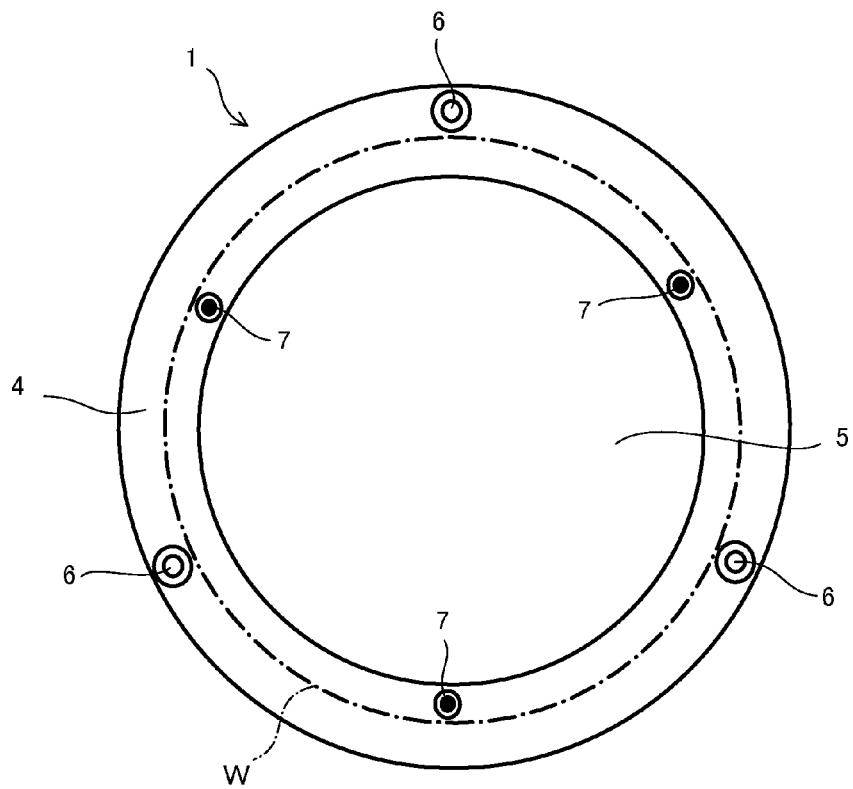
FIG. 2 is a plan view of the stage shown in FIG. 1.
Figure 3:
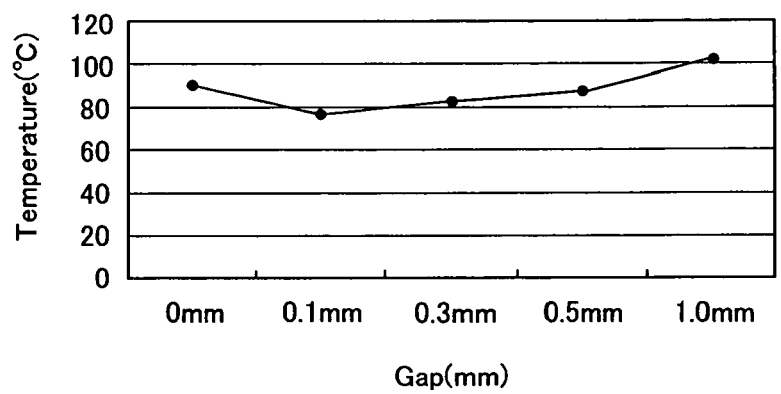
FIG. 3 is a graph that shows the relation between a temperature and a distance from the bottom surface of a concave portion to the underside of a substrate.
Figure 4:
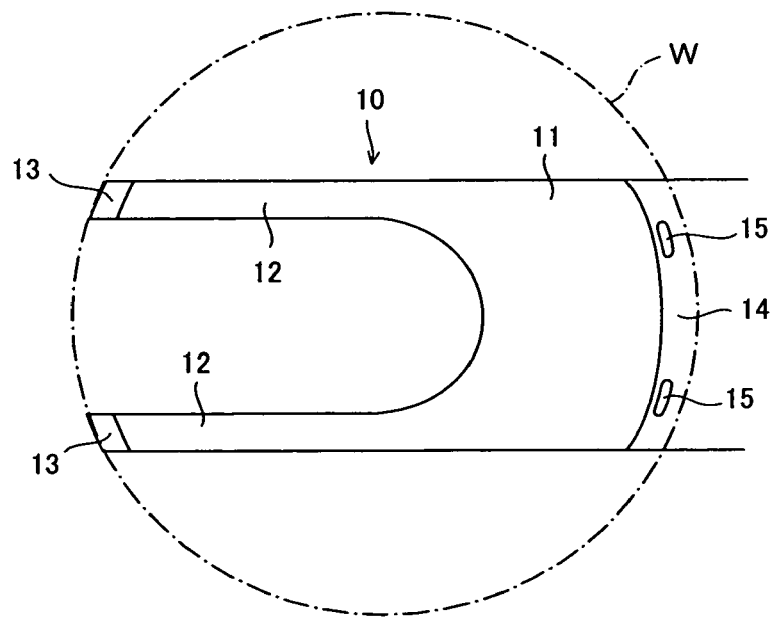
FIG. 4 is a plan view of a hand that delivers a substrate to a stage.
Figure 5:
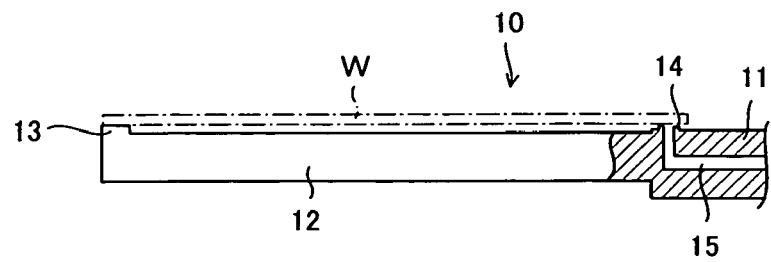
FIG. 5 is a side view of the hand shown in FIG. 4.

The stage for a substrate according to the present invention is described hereunder with reference to the attached drawings. FIG. 1 is a front view of the stage according to the present invention. FIG. 2 is a plan view of the stage shown in FIG. 1. FIG. 3 is a graph that shows the relation between a cooling effect and a distance between the stage and the underside of a substrate. FIG. 4 is a plan view of a hand that delivers a substrate to the stage. FIG. 5 is a side view of the hand shown in FIG. 4.

A stage 1 is made from a dielectric such as a ceramic material. An electrostatic attraction electrode 2 and a channel 3 in which a coolant such as water flows are formed inside the stage 1. An annular flange portion 4 is formed on the top surface of the stage 1. The inner side of the flange portion 4 forms a concave portion 5. In this connection, the stage is not limited to use of an electrostatic attraction, and may use a vacuum chuck.

The top surface of the flange portion 4 is provided with a smooth finish in order to mount a peripheral section of the underside of a substrate W thereon. It will be understood from FIG. 1 that the substrate W that has a concavo-convex portion Wc formed on an underside thereof. A representative concavo-convex portion Wc formed on the underside of the substrate W is shown in an exploded view of FIG. 1. Three positioning pins 6 are implanted in the flange portion 4 at regular intervals in the circumferential direction. In this connection, the number of positioning pins 6 may be three or more, and the number is preferably between three and ten, and more preferably is eight.

The positioning pins 6 are formed in a frustoconical shape, and by dropping the substrate W onto the inner portion that is surrounded by a plurality of the positioning pins 6, the center of the substrate W and the center of the stage 1 are automatically positioned so as to be aligned along a tapered face on the inner side of the positioning pins 6, even though the alignment may be a rough alignment to a certain extent.

Through holes 8 of lift pins 7 are formed at positions that are further on the inner side in the diametrical direction than the positioning pins 6 on the top surface of the flange portion 4. In this connection, it is desirable to arrange the holes of the through holes 8 so that the holes are not located further on the outside than the substrate W when the substrate W is mounted on the flange portion 4, and also so that they are positioned as close as possible to the outer circumferential face of the substrate W. If the holes of the through holes 8 are located further on the outside than the substrate W when the substrate W has been mounted, for example, when performing a process under a reduced pressure, such as a plasma etching process, the etching resistance may be lost. The number of lift pins 7 may be three or more than three, is preferably between three and six, and is more preferably four. In this connection, the configuration adopted is such that the lift pins 7 do not overlap with the positioning pins 6 in the circumferential direction, and the lift pins 7 are respectively positioned midway between a positioning pin 6 and a positioning pin 6. By arranging the positioning pins 6 and lift pins 7 uniformly along the circumferential direction in this manner, the processing rate becomes uniform.

Although the bottom surface of the concave portion 5 is flat in the drawings, taking into account bending of the substrate W, the bottom surface may be provided as a concave spherical surface in which the central part is deepest.

The graph in FIG. 3 shows the relation between the gap between the bottom surface of the concave portion 5 of the stage and the underside of the substrate W and the cooling effect. In this case, the temperature of the underside of the substrate was measured when the temperature of a chiller was 60° C. Based on this graph, it can be said that a gap of 0.1 to 0.3 mm is preferable.

As shown in FIGS. 4 and 5, a hand 10 that delivers the substrate W to the stage 1 is formed with two fingers 12 which extend parallel to each other from a base 11. At a distal end portion of each finger 12, a mounting portion 13 is formed in a raised condition. At the base 11, a mounting portion 14 is also formed in a raised condition along an outer circumferential edge of the substrate W that is held. Suction holes 15 are formed in the mounting portion 14. Since the suction holes suck only an outer circumferential edge of a wafer, i.e. a contactable region of a wafer, even if a circuit is formed on the underside of the wafer, the circuit is not damaged.

With the above configuration, when the substrate W that is sucked and held by the hand 10 is conveyed to the upper part of the stage 1, the lift pins 7 rise to accept the substrate W from the hand 10. Thereafter, the hand 10 retreats and the lift pins 7 descend. Thereupon, only the peripheral section of the substrate W is mounted to the flange portion 4 of the stage 1 such that the center of the substrate W is aligned with the center of the stage 1 by means of the tapered face of the positioning pins 6. Plasma treatment or the like is performed in this state.

The stage according to the present invention can be utilized for manufacturing MEMS utilizing photolithography techniques and the like.

What is claimed is:

1. A stage for a substrate that is a stage which mounts thereon a substrate that has a concavo-convex portion formed on an underside thereof, wherein:
    the stage is provided with a flange portion for supporting a peripheral section of a substrate which does not have a circuit formed on the peripheral section, the flange portion having a plurality of through holes formed therein;
    the stage also includes a concave portion that forms a gap with the underside of the substrate, the concave portion provided on the stage inside of the flange portion;
    a plurality of substrate positioning pins are formed on and extend upwardly from a top surface of the flange portion at a first radial distance from a center of the stage; and
    a plurality of lift pins for transferring a substrate pass through the through holes of the flange portion, the lift pins being separate from the substrate positioning pins and disposed at a second radial distance from the center of the stage, said second radial distance being less than said first radial distance;
    wherein said plurality of substrate positioning pins and said plurality of lift pins contact only an end portion of the substrate; and wherein said plurality of substrate positioning pins and said plurality of lift pins do not contact a portion of the substrate having the circuit formed thereon.

2. The stage for a substrate according to claim 1, further comprising a substrate, wherein the concavo-convex portion of the substrate comprises an electric circuit.

3. The stage for a substrate according to claim 1, wherein a shape of a bottom surface of the concave portion of the stage is formed with a curved shape in which a central part is a deepest part and an outer circumferential section is a shallowest part.

4. The stage for a substrate according to claim 1, wherein a number of the positioning pins and the lift pins is three or more, respectively, and the positioning pins and the lift pins are arranged at regular intervals in a circumferential direction, respectively.

5. The stage for a substrate according to claim 1, wherein each of the positioning pins comprises a tapered upper portion formed in a substantially frustoconical shape.

6. The stage for a substrate according to claim 1, further comprising an electrostatic attraction electrode disposed below the concave portion of said stage.

7. The stage for a substrate according to claim 1, further comprising a hand for delivering the substrate to the stage, the hand comprising a base having a raised mounting portion thereon, and two fingers which extend substantially parallel to each other from the base, wherein a distal end portion of each finger comprises a raised mounting portion.

8. A stage for a substrate comprising a stage member which mounts thereon a substrate that has a concavo-convex portion formed on an underside thereof, wherein:
    the stage member is provided with a flange portion for supporting a peripheral section of a substrate which does not have a circuit formed on the peripheral section, the flange portion having a plurality of through holes formed therein;
    the stage member having a concave portion that forms a gap with the underside of the substrate, the concave portion being provided on the stage member inside of the flange portion;

a plurality of substrate positioning pins are formed on and extend upwardly from a top surface of the flange portion at a first radial distance from a center of the stage member, wherein each of the positioning pins comprises a tapered upper portion formed in a substantially frusto-conical shape; and a plurality of lift pins for transferring a substrate pass through the through holes of the flange portion, the lift pins being separate from the substrate positioning pins and disposed at a second radial distance from the center of the stage, said second radial distance being less than said first radial distance.

9. The stage for a substrate according to claim 8, further comprising an electrostatic attraction electrode disposed below the concave portion of said stage member.

10. The stage for a substrate according to claim 8, further comprising a hand for delivering the substrate to the stage member, the hand comprising a base having a raised mounting portion thereon, and two fingers which extend substantially parallel to each other from the base, wherein a distal end portion of each finger comprises a raised mounting portion of the finger.

* * * * *